United States Patent
Chang et al.

(10) Patent No.: US 9,651,869 B2
(45) Date of Patent: May 16, 2017

(54) FILM PORTION AT WAFER EDGE

(71) Applicant: TAIWAN SEMICONDUCTOR MANUFACTURING COMPANY, LTD., Hsinchu (TW)

(72) Inventors: Chun-Wei Chang, Tainan (TW); Wang-Pen Mo, Pingtung (TW); Hung-Chang Hsieh, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/680,546

(22) Filed: Apr. 7, 2015

(65) Prior Publication Data

US 2015/0212420 A1    Jul. 30, 2015

Related U.S. Application Data

(62) Division of application No. 13/764,155, filed on Feb. 11, 2013, now Pat. No. 9,372,406.
(Continued)

(51) Int. Cl.
*G03F 7/20* (2006.01)
*H01L 21/308* (2006.01)
(Continued)

(52) U.S. Cl.
CPC .............. *G03F 7/20* (2013.01); *G03F 7/0002* (2013.01); *H01L 21/0274* (2013.01);
(Continued)

(58) Field of Classification Search
CPC ..... G03F 7/20; G03F 7/0002; H01L 21/0274; H01L 21/3085; H01L 21/31144; H01L 21/31058
See application file for complete search history.

(56) References Cited

U.S. PATENT DOCUMENTS 6,423,609 B1 * 7/2002 Van Itallie ........ H01L 27/10852
257/296
6,790,570 B1 * 9/2004 Stirton ................ G03F 7/70616
356/369
(Continued)

OTHER PUBLICATIONS

S. Wolf and R.N. Tauber, (Silicon Processing for the VLSI Era, vol. 1—Process Technology, Lattice Press, 1986) (pp. 407-409).*

*Primary Examiner* — Nadine Norton
*Assistant Examiner* — Mahmoud Dahimene
(74) *Attorney, Agent, or Firm* — Hauptman Ham, LLP

(57) ABSTRACT

A method for preparing a wafer includes forming a film layer on a substrate of the wafer; coating the film layer with a photoresist layer; exposing a first portion of the photoresist layer to a beam of light; and patterning a second portion of the photoresist layer after performing exposing the first portion of the photoresist layer. A cross-link reaction is caused on the first portion of the photoresist layer and the first portion of the photoresist layer is converted to a reacted first portion of the photoresist layer. The reacted first portion of the photoresist layer is near an edge of the wafer. The second portion of the photoresist layer is different from the reacted first portion of the photoresist layer. The second portion of the photoresist layer is converted to a patterned second portion of the photoresist layer.

20 Claims, 8 Drawing Sheets

Related U.S. Application Data

(60) Provisional application No. 61/624,089, filed on Apr. 13, 2012.

(51) Int. Cl.
*H01L 21/027* (2006.01)
*G03F 7/00* (2006.01)
*H01L 21/3105* (2006.01)
*H01L 21/311* (2006.01)

(52) U.S. Cl.
CPC .... *H01L 21/3085* (2013.01); *H01L 21/31058* (2013.01); *H01L 21/31144* (2013.01)

(56) References Cited

U.S. PATENT DOCUMENTS

| | | | |
|---|---|---|---|
| 2010/0279505 A1* | 11/2010 | Yang | G03F 7/0035 438/689 |
| 2012/0268721 A1* | 10/2012 | Yang | G03F 7/2022 355/67 |

* cited by examiner

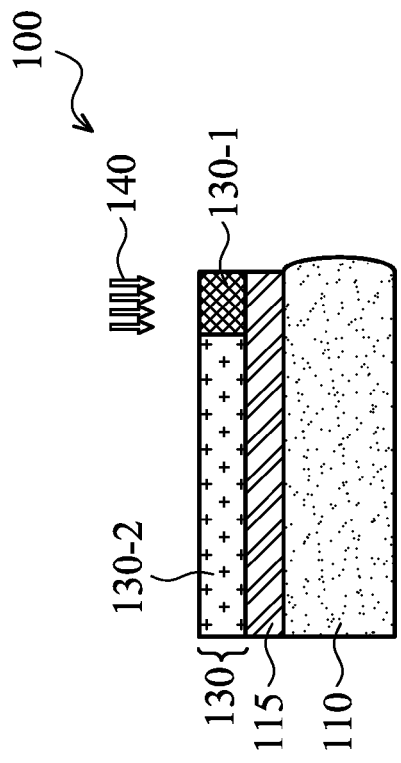
Fig. 2B
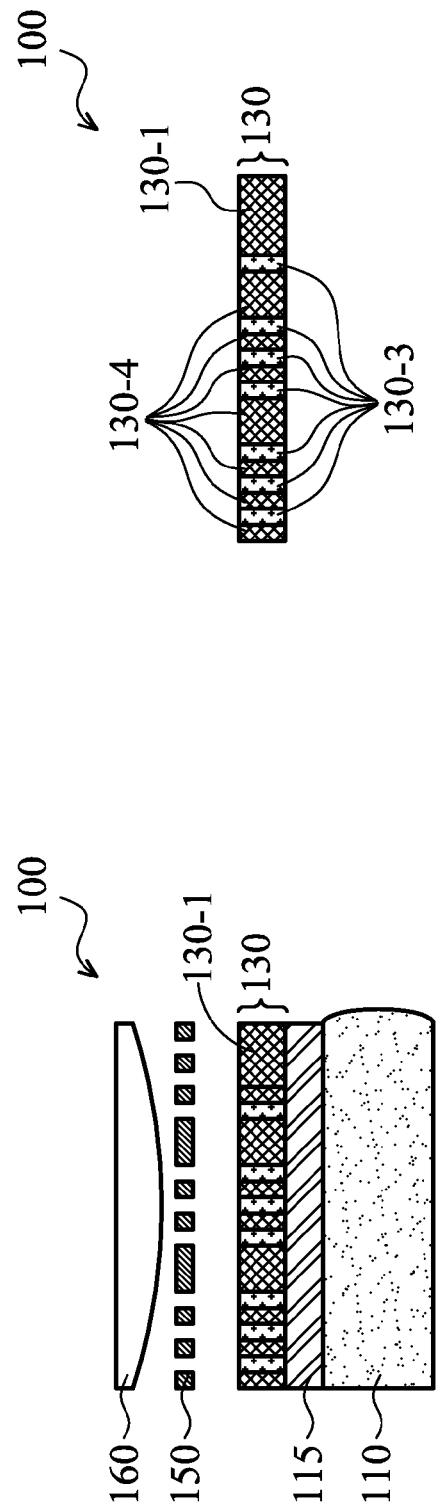
Fig. 2C-1
Fig. 2A
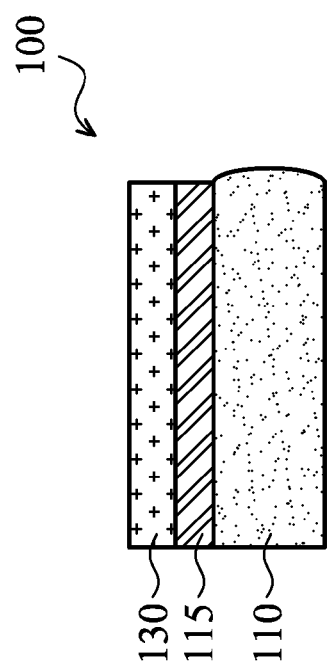
Fig. 2C

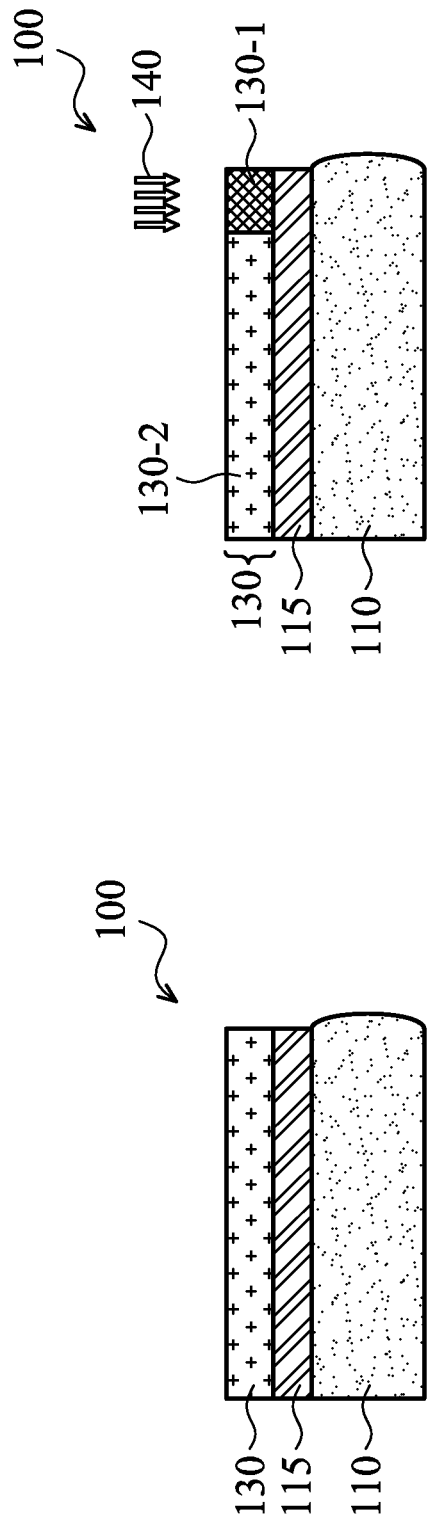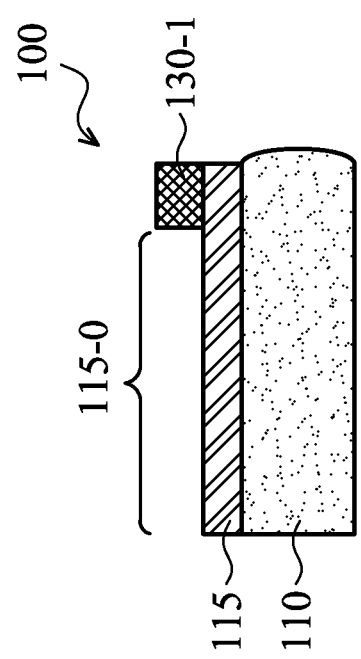

FILM PORTION AT WAFER EDGE

PRIORITY CLAIM

The present application is a divisional of U.S. application Ser. No. 13/764,155, filed Feb. 11, 2013, now U.S. Pat. No. 9,372,406, which claims the priority of U.S. Provisional Application No. 61/624,089, filed Apr. 13, 2012, which are incorporated herein by reference in their entireties.

FIELD

The present disclosure is related to a film portion at an edge of a wafer.

BACKGROUND

In some existing approaches of wafer preparation, a positive photoresist layer is used without a wafer edge exposure (WEE) process. The photoresist layer, however, is easily peeled off the wafer. In a process using the positive photoresist layer with the WEE process, various problems exist at the wafer edge. For example, at a resist protective oxide (RPO) layer, a film thickness is reduced because the film including oxide in the RPO layer and/or an inter-metal dielectric (IMD) layer is removed at the wafer edge. Metal such as silicide or copper is high at the WEE area. At the metal layers, copper from a copper deposition step exists at the wafer edge, and results in step-height or wafer non-uniformity. During wafer trimming of a back side illumination (BSI) process, the WEE process also causes non-uniformity at the wafer edge. To prevent wafer cracks, wafer trimming is used to remove the areas of non-uniformity. Metal powder from wafer trimming also results in a high metal content. The metal tends to migrate to other areas of the wafer and contaminates functional dies. Metal at the wafer edge also affects a dark current of image-sensors and thus affects performance of the image-sensors.

BRIEF DESCRIPTION OF THE DRAWINGS

The details of one or more embodiments of the disclosure are set forth in the accompanying drawings and the description below. Other features and advantages will be apparent from the description, drawings, and claims.

FIGS. 2A-2E are cross sectional views of the wafer in FIG. 1A at various stages of production in which a film portion is retained at the edge of the wafer, in accordance with some embodiments.

FIGS. 3A-3H are cross sectional views of the wafer in FIG. 1A at various stages of production in which a film portion is retained at the edge of the wafer, in accordance with some further embodiments.

Like reference symbols in the various drawings indicate like elements.

DETAILED DESCRIPTION

Figure 1B:
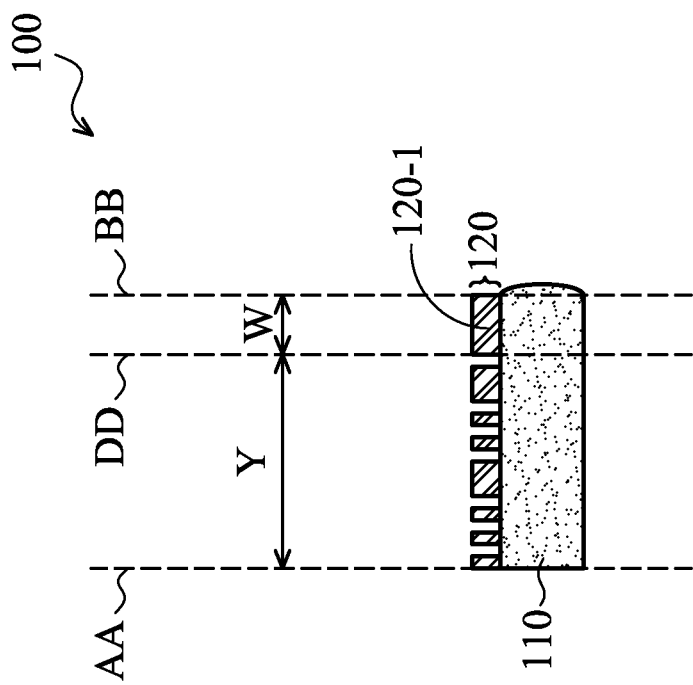
FIG. 1B is a cross sectional view of the wafer in FIG. 1A, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. A lithography process with a negative resist is used to reduce metal contamination. The lithography process also reduces wafer cracks due to step heights. The wafer edges therefore have a better topography. A trimming width at the wafer edges is narrower than that of an existing approach. As a result, image performance of a back side illumination (BSI) is improved. Defects from trimming are reduced, and die yield is improved.

Exemplary Wafer

Figure 1A:
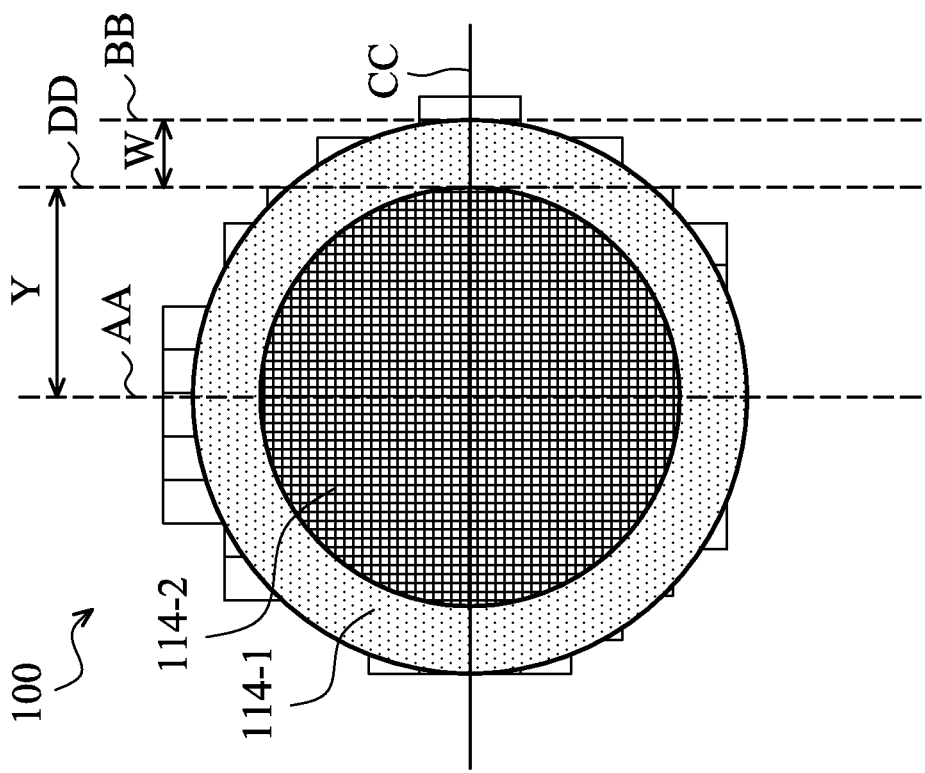
FIG. 1A is a top view of a wafer, in accordance with some embodiments.

FIG. 1A is a top view, and FIG. 1B is a cross sectional view of a wafer 100, in accordance with some embodiments. In FIG. 1B, wafer 100 is shown along a line CC and in between lines AA and BB of FIG. 1A. Effectively, the cross sectional view in FIG. 1B is the view of a quarter of wafer 100.

A substrate 110 includes different dopant areas based on which semiconductor devices are formed. Exemplary dopant areas include diffusion areas having N−, N, N+, P−, P, P+ dopant types, N-wells, P-wells, etc. Exemplary devices include transistors of different dopant types, such as N-type metal-oxide semiconductor (NMOS) and P-type metal-oxide semiconductor (PMOS) transistors, MOS capacitors, varactors, etc.

A film layer 120 includes different materials and/or layers that, together with the dopant areas in substrate 110, form the semiconductor devices. For example, film layer 120 includes polysilicon or poly areas, metal layers, oxide in a resistive protective oxide (RPO) layer, silicon nitride, silicon oxynitride, silicon carbide, dielectric materials, etc. For another example, a transistor is formed by a first diffusion area serving as a drain terminal, a second diffusion area serving as a source terminal, and a poly area serving as a gate terminal. Metal layers are used for electrically connecting different electrical components together. Metal layers may include inter-metal dielectric (IMD) layers. Depending on applications, the metal layers include a layer one, a layer two, a layer three, etc., which are called a metal one, a metal two, a metal three, etc., respectively.

A ring 114-1 of film 120 is kept substantially near an edge of wafer 100. The edge of wafer 100 is illustrated by line BB. Ring 114-1 defines a boundary for wafer 100. For example, a portion 114-2 of wafer 100 inside ring 114-1 includes a plurality of dies from which integrated circuits (IC) are manufactured. There is no die or functional IC outside of ring 114-1.

Ring 114-1 in FIG. 1A corresponds to a film portion 120-1 in FIG. 1B. Film portion 120-1 or ring 114-1 remains at or substantially near an edge of wafer 100 based on different manufacturing processes that are illustrated with reference to FIGS. 2A-2E, FIGS. 3A-3H, and FIGS. 4A-4E.

A width W of film portion 120-1 is predetermined considering various factors such as a probable width of a crack area of wafer 100, a thickness of wafer 100, materials used for film layer 120, etc. In some embodiments, width W is at least 3 mm. Different values for width W are within the scope of various embodiments. Width W is defined by a first edge of ring 114-1 and a second edge of ring 114-1. The first edge of ring 114-1 corresponds to a first edge of portion 120-1, and is illustrated by line BB. The second edge of ring 114-1 corresponds to a second edge of portion 120-1, and is illustrated by line DD. The first edge of ring 114-1 being aligned with line BB is for illustration. Other positions of the first edge of ring 114-1 are within the scope of various embodiments. In FIG. 1A, wafer 100 and thus ring 114-1 being round are for illustration. Other shapes of wafer 100 and/or of corresponding ring 114-1 are within the scope of various embodiments.

Various embodiments of the disclosure are advantageous. For example, the edge of wafer 100 is not uniform. Some areas are thinner than some other areas. Further, after bonding two wafers such as two wafers 100, the edge of two bonded wafers 100 is trimmed to remove the non-uniform area and the crack area near the edge of the two bonded wafers 100. Film portion 120-1 results in a smaller non-uniform area and a smaller crack area for each wafer 100 to be bonded, and thus a smaller removal area for two bonded wafers 100. In contrast, in some existing approaches, because there is no film portion corresponding to film portion 120-1 of the present disclosure near the edge of wafer 100, the non-uniform area and the crack area are larger, resulting in a larger removal area.

Retaining a Film Portion at a Wafer Edge

FIGS. 2A-2E are cross sectional views of wafer 100, in accordance with some embodiments. In FIGS. 2A-2E, wafer 100 is shown illustratively at different stages of a manufacturing process, and results in the cross sectional view in FIG. 1B.

In FIG. 2A, a film layer 115 is formed on top of substrate 110. Film layer 115 is subject to various manufacturing processes and transforms into film layer 120 in FIG. 1B. A negative photoresist layer 130 is coated on top of film layer 115. Different ways to deposit film layer 115 on substrate 110 and to deposit negative photoresist layer 130 on film layer 115 are within the scope of various embodiments.

In FIG. 2B, a portion 130-1 of negative photoresist layer 130 is subjected to a wafer edge exposure (WEE) process. Portion 130-1 corresponds to portion 120-1 of film layer 120 in FIG. 1A. In the WEE process, a beam of light 140 is provided to portion 130-1. As a result, the WEE process is also called a light exposure process. In some embodiments, light 140 is emitted from mercury lights. Other types of light sources and light having different wavelengths are within the scope of various embodiments. Exemplary light sources include I-line lights, KrF lights, ArF lights, which have respective wavelengths of 365 nm, 248 nm, and 193 nm. Light propagating through water using an immersion technology and electron beams are also within the scope of various embodiments. Properties of portion 130-1 change characteristics as portion 130-1 reacts with lights 140. A portion 130-2 of layer 130 is not subjected to light and therefore maintains previous property characteristics. The WEE process prevents portion 130-1 from being patterned when portion 130-2 of negative photoresist layer 130 is latter patterned.

In FIG. 2C, a mask 150 and a light source 160 are used to pattern negative photoresist layer 130. Mask patterning by mask 150 and light source 160 is used to define electrical circuits, devices, etc., in wafer 100. Light 140 and other mechanisms used in the WEE process may be used in place of light source 160. Mask patterning using mask 150 and/or light source 160 are used for illustration. Other mechanisms such as a nano-imprint process, a direct e-beam writing with a photoresist layer and without mask 150 are within the scope of various embodiments.

In a mask patterning process, some light is blocked and some light is allowed to pass through mask 150 to pattern photo resist layer 130. Effectively, some portions of layer 130 are exposed to light from light source 160 through mask 150, and some other portions are not exposed to light from light source 160 through mask 150. For illustration, in FIG. 2C-1, a plurality of portions 130-4 of portion 130-2 is exposed to light from light source 160 through mask 150, and therefore reacts to light from light source 160 that pass through mask 150. In contrast, a plurality of portions 130-3 of portion 130-2 is not exposed to light from light source 160, and therefore maintains the same characteristic of the negative photoresist layer 130. Because portion 130-1 has been reacted with light 140 in FIG. 2B, portion 130-1 is not affected by light from light source 160. In other words, portion 130-1 is not patterned by mask 150 and light source 160.

Figure 2D:
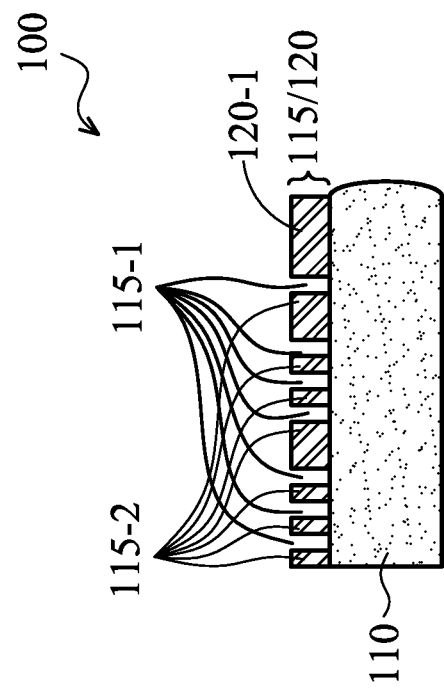

In FIG. 2D, portions 130-3 in FIG. 2C that include the original resist material in layer 130 are removed, resulting in corresponding openings 130-5. Portion 130-1 and portions 130-4 that have been patterned remain on top of film layer 115.

Figure 2E:
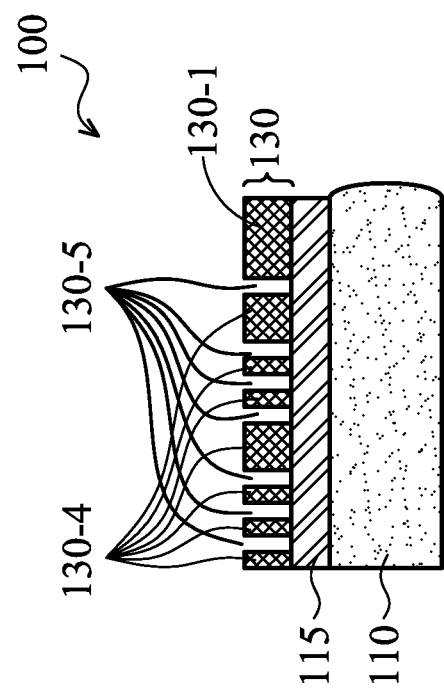

In FIG. 2E, a plurality of portions 115-1 of layer 115 corresponding to openings 130-5 in FIG. 2D is removed. In some embodiments, removing portions 115-1 is done by etching. A plurality of portions 115-2 of layer 115 is not removed. The etched layer 115 becomes layer 120 that includes portion 120-1 corresponding to portion 130-1 in FIG. 2D. Portions 130-4 in FIG. 2D are then removed. The cross sectional view of wafer 100 in FIG. 2E is the cross sectional view of wafer 100 in FIG. 1B.

Retaining a Film Portion at a Wafer Edge, Some Further Embodiments

FIGS. 3A-3H are cross sectional views of wafer 100, in accordance with some further embodiments. FIGS. 3A-3H are used to illustrate wafer 100 being subject to a dual lithography process.

In FIGS. 3A-3C, wafer 100 is subject to a first lithography process with a negative photoresist. FIGS. 3A and 3B are the same as FIGS. 2A and 2B, respectively. As illustratively shown in FIG. 3A, film layer 115 over substrate 110 is coated with a negative photoresist layer 130. In FIG. 3B, portion 130-1 is subject to the WEE process with light 140 to prepare for the formation of portion 120-1 in FIG. 1B. A portion 130-2 is not subject to light 140. The WEE process in FIG. 3B prevents portion 130-1 from being removed while portion 130-2 is later removed in FIG. 3C. In FIG. 3C, portion 130-1 remains on top of film layer 115 while portion 130-2 is removed. As a result, a portion 115-0 of layer 115 is exposed.

Figure 3D:
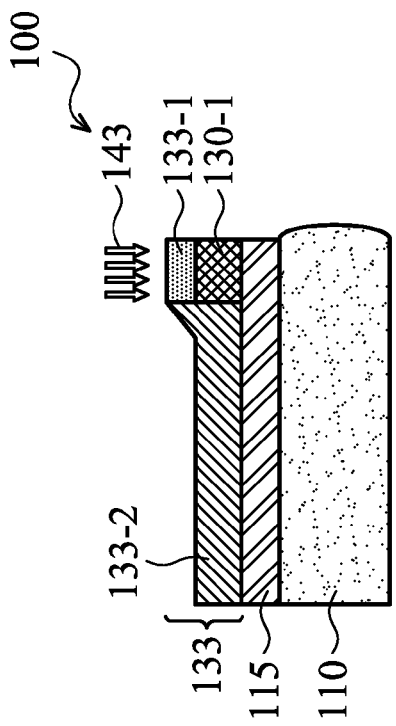
Figure 3E:
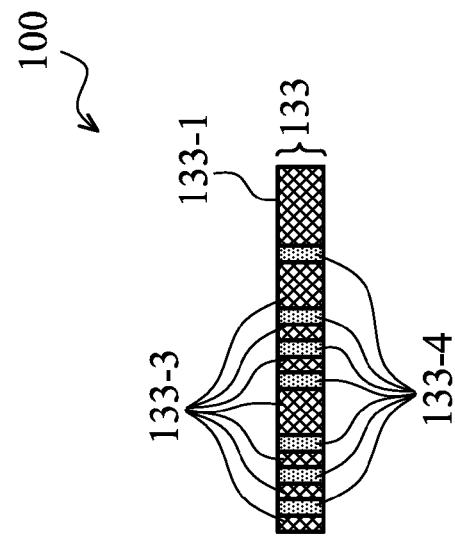

In FIGS. 3D-3H, wafer 100 is subject to a second lithography process or patterning with a positive photoresist. In FIG. 3D, a positive photoresist layer 133 is coated over layer 115 and portion 130-1. In FIG. 3E, portion 130-1 and a corresponding portion 133-1 of layer 133 are subject to a beam of light 143 by a WEE process. A portion 133-2 of layer 133 is not subject to the WEE process.

Figure 3F:
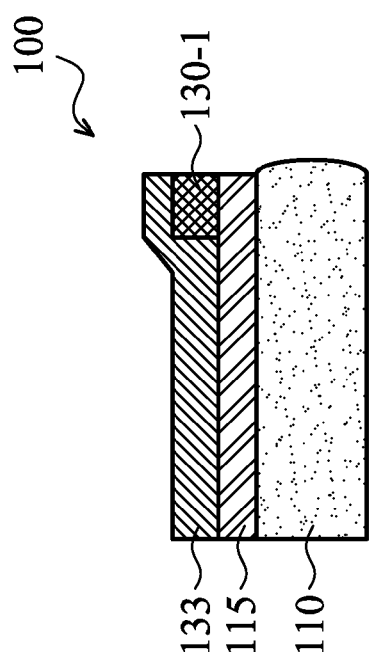
Figures 1, 3F:
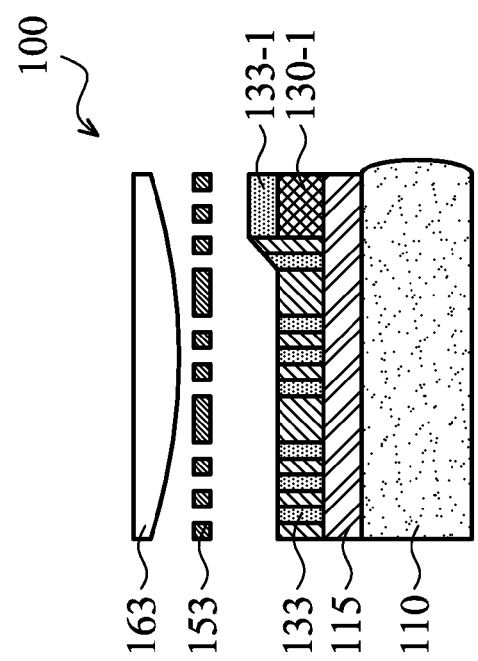

In FIG. 3F, a mask 153 and a light source 163 are used to pattern positive photoresist layer 133. Some light is blocked and some light is allowed to pass through mask 153 to pattern layer 133. For illustration, in FIG. 3F-1, a plurality of portions 133-4 of layer 133 is exposed to light from light source 163 through mask 153, and therefore reacts to light from light source 163. In contrast, a plurality of portions 133-3 is not exposed to light from light source 163, and therefore maintains the same characteristic of layer 133. Because portion 133-1 has been reacted with light 143 in FIG. 3E, portion 133-1 is not affected by light from light source 163. In other words, portion 133-1 is not patterned by mask 153 and light from light source 163. In various embodiments, the WEE process in FIG. 3E is not performed as the WEE process has been performed in FIG. 3B.

Figure 3H:
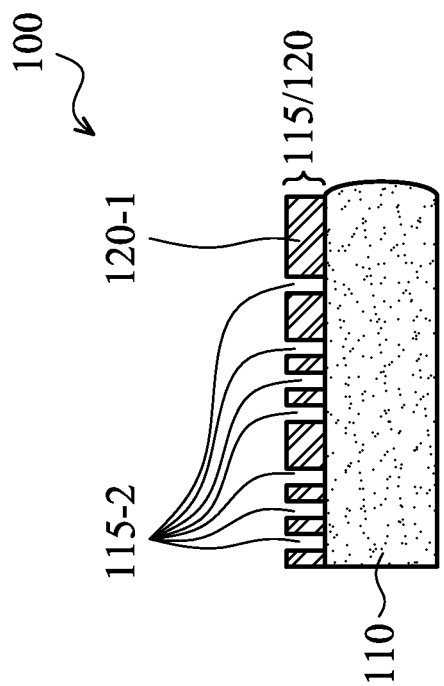
Figure 3G:
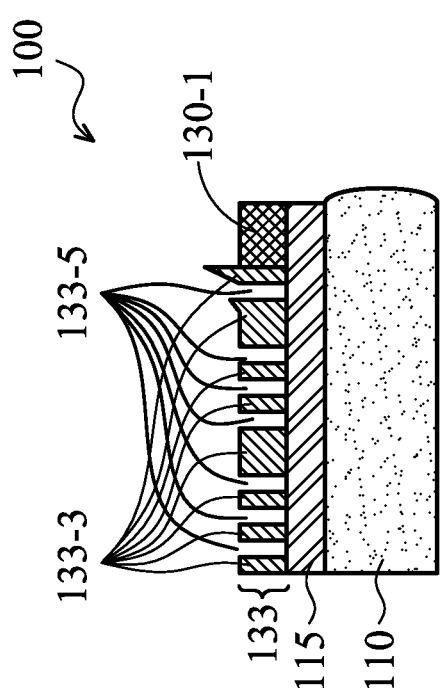

In FIG. 3G, portion 133-1 and the plurality of portions 133-3 that include the original photoresist material in layer 133 remain on top of layer 115. Portions 133-4 in FIG. 3F that have been patterned are removed, resulting in openings 133-5.

In FIG. 3H, a plurality of portions 115-2 of layer 115 corresponding to openings 133-5 in FIG. 3G is removed, and is etched in some embodiments. The etched layer 115 becomes layer 120 that includes portion 120-1 corresponding to portion 130-1 in FIG. 3G. Portions 133-3 in FIG. 3G are also removed. The cross sectional view of wafer 100 in FIG. 3H is the cross sectional view of wafer 100 in FIG. 1B.

Retaining a Film Portion at a Wafer Edge, Some Further Embodiments

FIGS. 4A-4E are cross sectional views of wafer 100, in accordance with some further embodiments. FIGS. 4A-4E are used to illustrate the process of preparing wafer 100 by a WEE process with a high energy level on a positive photoresist layer 138.

Figure 4A:
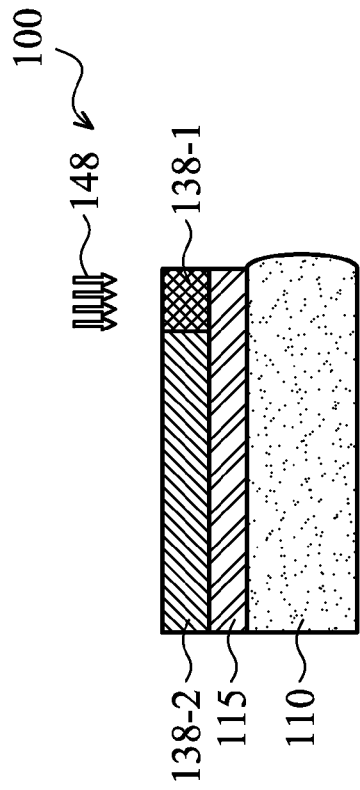
FIGS. 4A-4E are cross sectional views of the wafer in FIG. 1A at various stages of production in which a film portion is retained at the edge of the wafer, in accordance with some further embodiments.

In FIG. 4A, positive photoresist layer 138 is coated on top of film layer 115, which is on top of substrate 110. In FIG. 4B, a portion 138-1 of positive photoresist layer 138 is subject to the WEE process with a high energy level. In some embodiments, a normal or average energy level is about 10-20 mJ/cm$^2$, and the high energy level is about 60 mJ/cm$^2$ or higher. Other high energy level values, such as 30-60 mJ/cm$^2$ are within the scope of various embodiments. A beam of light 148 is used with the high energy WEE process. In some embodiments, light 148 includes deep ultraviolet light (DUV) having a wavelength of 248 nm. Effectively, portion 138-1 is subject to DUV light 148 having a high energy level. As a result, a cross-link reaction takes place in portion 138-1 so that portion 138-1 remains on top of film layer 115 during subsequent processing. Corresponding film portion 120-1 in FIG. 1B therefore later remains on top of substrate 110 and at the edge of wafer 100. A portion 138-2 of positive photoresist layer 138 is not subject to the WEE process. Various embodiments of the disclosure are advantageous because the cross-link reaction maintains portion 138-1 on top of film layer 115. In other approaches that use a normal or low energy level, such as below 20 mJ/cm2, the cross-link reaction does not take place.

Figure 4C:
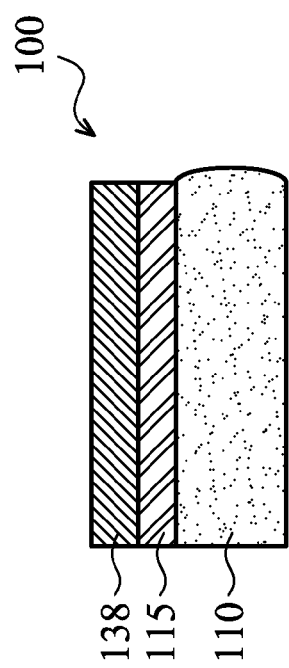
Figure 4B:
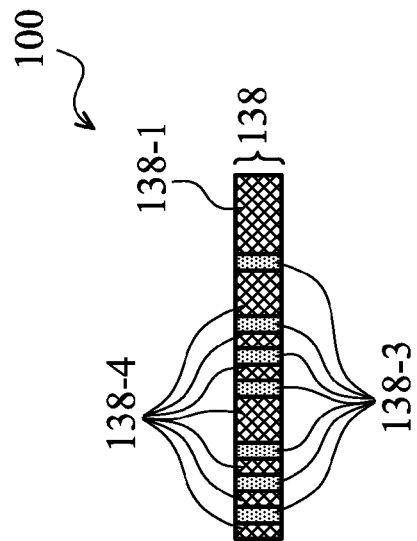
Figures 1, 4C:
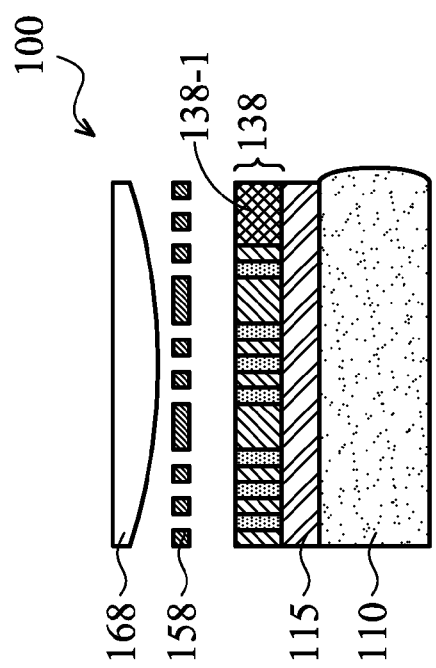

In FIG. 4C, a mask 158 and a light source 168 are used to pattern positive photoresist layer 138. Mask patterning by mask 158 and light source 168 are used to define electrical circuits, devices, etc., in wafer 100. In a mask patterning process, some light is blocked and some light is allowed to pass through mask 158 to pattern layer 138. For illustration, in FIG. 4C-1, a plurality of portions 138-3 of portion 138-2 is exposed to light from light source 168 through mask 158, and therefore reacts to light from light source 168 that passes through mask 158. In contrast, a plurality of portions 138-4 of portion 138-2 is not exposed to light from light source 168, and therefore maintains the same characteristic of the positive resist material in layer 138. Because portion 138-1 has been reacted with light 148 in FIG. 4B, portion 138-1 is not affected by light from light source 168. In other words, portion 138-1 is not patterned.

Figure 4E:
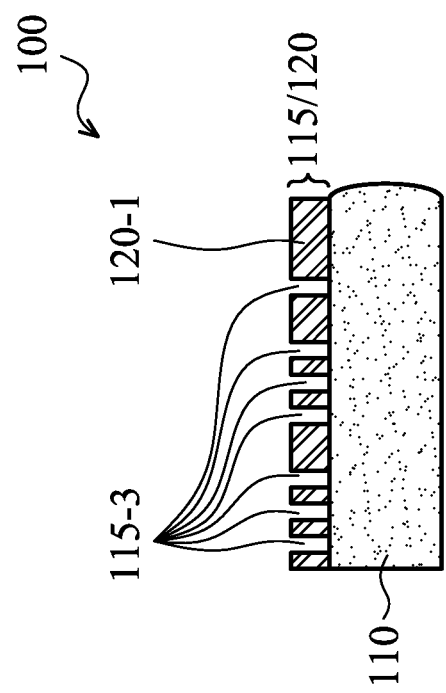
Figure 4D:
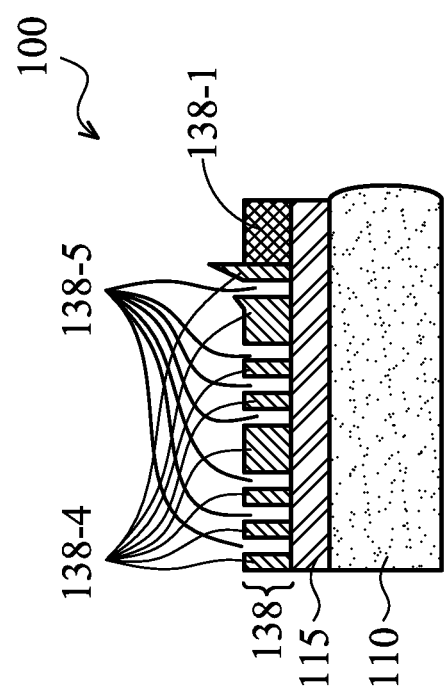

In FIG. 4D, portion 138-1 and portions 138-4 that include the original resist material in layer 138 remain on top of layer 115. Portions 138-3 in FIG. 4C that have been subject to light are removed, resulting in corresponding openings 138-5.

In FIG. 4E, portions 115-3 of layer 115 corresponding to openings 138-5 are removed, and are etched in some embodiments. The etched layer 115 becomes layer 120 that includes portion 120-1 corresponding to portion 138-1. Portions 138-4 in FIG. 4D are also removed. The cross sectional view of wafer 100 in FIG. 4E is the cross sectional view of wafer 100 in FIG. 1B.

A number of embodiments have been described. It will nevertheless be understood that various modifications may be made without departing from the spirit and scope of the disclosure. For example, light is used in conjunction with masks 150, 153, 158, but various embodiments of the disclosure are not so limited. Other energy sources such as electron beams are within the scope of various embodiments.

In accordance with some embodiments, a method for preparing a wafer includes forming a film layer on a substrate of the wafer; coating the film layer with a photoresist layer; exposing a first portion of the photoresist layer to a beam of light; and patterning a second portion of the photoresist layer after performing exposing the first portion of the photoresist layer. A cross-link reaction is caused on the first portion of the photoresist layer and the first portion of the photoresist layer is converted to a reacted first portion of the photoresist layer. The reacted first portion of the photoresist layer is near an edge of the wafer. The second portion of the photoresist layer is different from the reacted first portion of the photoresist layer. The second portion of the photoresist layer is converted to a patterned second portion of the photoresist layer. The method further includes patterning the film layer based on the reacted first portion of the photoresist layer and the patterned second portion of the photoresist layer.

In accordance with some embodiments, a method for preparing a wafer includes patterning a film layer on a substrate of the wafer to form a first plurality of areas of the film layer and a second plurality of areas of the film layer. Patterning the film layer includes coating the film layer with a positive photoresist layer; performing a wafer edge exposure process on a first portion of the positive photoresist layer; and patterning the positive photoresist layer, to form a first plurality of areas of the positive photoresist layer and a second plurality of areas of the positive resist layer. The first portion of the positive photoresist layer corresponds to a first portion of the film layer, and a first edge of the first portion of the film layer is adjacent to an edge of the wafer. The first plurality of areas of the positive photoresist layer corresponds to a first plurality of areas of the film layer, and the second plurality of areas of the positive photoresist layer corresponds to a second plurality of areas of the film layer. The method for preparing a wafer further includes keeping the second plurality of areas of the film layer on the substrate; keeping the first portion of the film layer on the substrate; and removing the first plurality of areas of the film layer.

In accordance with some embodiments, a method includes coating a film layer with a positive photoresist layer, where the film layer is over a substrate of a wafer; performing a wafer edge exposure process on a first portion of the positive photoresist layer, where the first portion of the positive photoresist layer corresponds to a portion of the film layer; patterning the positive photoresist layer; removing second positive photoresist portions of the positive photoresist layer, thereby resulting in corresponding openings in the positive photoresist layer; and removing portions of the film layer corresponding to the openings, without removing the portion of the film layer corresponding to the first portion of the positive photoresist layer on which the wafer edge exposure process was performed. An end of the portion of the film layer is substantially near an edge of the wafer. The wafer edge process includes causing a cross-linking reaction on the first portion of the positive photoresist layer. The second positive photoresist portions of the positive photoresist layer differ from the third positive photoresist portions of the positive photoresist layer.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A method for preparing a wafer, comprising:
   forming a film layer on a substrate of the wafer;
   coating the film layer with a first photoresist layer;
   exposing a first portion of the first photoresist layer to a first beam of light, thereby causing a cross-link reaction on the first portion of the first photoresist layer and converting the first portion of the first photoresist layer to a reacted first portion of the first photoresist layer, the reacted first portion of the first photoresist layer adjacent to an edge of the wafer, a second portion of the first photoresist layer being on the film layer separated from the edge of the wafer;
   removing the second portion of the first photoresist layer;
   coating the film layer and the first reacted portion of the first photoresist layer with a second photoresist layer;
   exposing a first portion of the second photoresist layer, over the reacted first portion of the first photoresist layer, to a second beam of light, to form a reacted first portion of the second photoresist layer;
   exposing a portion of the reacted first portion of the second photoresist layer and a second portion of the second photoresist layer, being directly on the film layer, to a third beam of light, thereby converting the second portion of the second photoresist layer to a patterned second portion of the second photoresist layer; and
   patterning the film layer based on the reacted first portion of the first photoresist layer and the patterned second portion of the second photoresist layer.

2. The method of claim 1, wherein the first beam of light uses using at least one of an energy level between 30 and 60 mJ/cm2, an energy level of at least 60 mJ/cm$^2$, or a light having a wavelength of about 248 nm.

3. The method of claim 1, wherein patterning the film layer comprises etching the film layer based on openings in the patterned second portion of the second photoresist layer.

4. The method of claim 1, wherein exposing the first portion of the first photoresist layer comprises:
   performing a wafer edge exposure process with an energy level greater than 30 mJ/cm$^2$.

5. The method of claim 1, wherein exposing the first portion of the first photoresist layer comprises performing a wafer edge exposure process with deep ultraviolet light.

6. The method of claim 1, wherein exposing a second portion of the second photoresist layer comprises:
   using a mask and an energy source; and removing a plurality of areas of the second photoresist layer that is exposed to the energy source through the mask; or
   using a nano-imprint process; or
   using a direct e-beam writing with the second photoresist layer.

7. The method of claim 6, wherein the energy source is selected from the group consisting of a light and an electron beam.

8. The method of claim 1, wherein the second photoresist layer is a positive photoresist layer.

9. A method for preparing a wafer, comprising:
   coating a film layer on a substrate of the wafer with a negative photoresist layer having a first portion, a first edge of the first portion of the film layer being adjacent to an edge of the wafer, the negative photoresist layer having a second portion;
   performing a first wafer edge exposure process on the first portion of the negative photoresist layer;
   removing the second portion of the negative photoresist layer; and
   patterning the film layer to form a first plurality of areas of the film layer and a second plurality of areas of the film layer, wherein patterning the film layer comprises:
      coating the film layer and the first portion of the negative photoresist layer with a positive photoresist layer;
      performing a second wafer edge exposure process on a first portion of the positive photoresist layer corresponding to the first portion of the negative photoresist layer, wherein the first portion of the positive photoresist covers an entirety of the first portion of the negative photoresist, and performing the second wafer edge exposure process comprises exposing an entirety of the first portion of the positive photoresist layer to an energy beam; and
      patterning the positive photoresist layer, to form a first plurality of areas of the positive photoresist layer and a second plurality of areas of the positive photoresist layer, wherein the first plurality of areas of the positive photoresist layer corresponds to a first plurality of areas of the film layer, and the second plurality of areas of the positive photoresist layer corresponds to a second plurality of areas of the film layer; and
      removing the first plurality of areas of the film layer, wherein removing the first plurality of areas of the film layer comprises keeping the second plurality of areas of the film layer on the substrate, and keeping a portion of the film layer under the first portion of the negative photoresist layer on the substrate.

10. The method of claim 9, wherein performing the second wafer edge exposure process on the first portion of the positive photoresist layer comprises:
   using at least one of an energy level between 30 and 60 mJ/cm$^2$, an energy level of at least 60 mJ/cm$^2$, or a light having a wavelength of about 248 nm.

11. The method of claim 9, wherein patterning the positive photoresist layer comprises:
   using a mask and an energy source; and removing the first plurality of areas of the positive photoresist layer, wherein the first plurality of areas of the positive photoresist layer is exposed to the energy source through the mask; or
   using a nano-imprint process; or
   using a direct e-beam writing with the negative photoresist layer.

12. The method of claim 11, wherein the energy source is selected from the group consisting of a light and an electron beam.

13. The method of claim 9, further comprising:
removing the first plurality of areas of the positive photoresist layer before removing the first plurality of areas of the film layer; and
removing the second plurality of areas of the positive photoresist layer after removing the first plurality of areas of the film layer.

14. The method of claim 9, wherein performing the second wafer edge exposure process on the first portion of the positive photoresist layer comprises:
using an energy level that is sufficient to cause a cross-link reaction on the first portion of the positive photoresist layer.

15. A method comprising:
coating a film layer with a negative photoresist layer, wherein the film layer is over a substrate of the wafer, and wherein a first portion of the negative photoresist layer corresponds to an edge portion of the film layer, an end of the edge portion of the film layer is adjacent to an edge of the wafer, and a second portion of the negative photoresist layer is on a central portion of the film layer;
performing a first wafer edge exposure process on the first portion of the negative photoresist layer;
removing the second portion of the negative photoresist layer;
coating the film layer and the first portion of the negative photoresist layer with a positive photoresist layer;
performing a second wafer edge exposure process on the first portion of the positive photoresist layer over the first portion of the negative photoresist layer;
patterning the positive photoresist layer;
forming openings in the positive photoresist layer based on the patterning of the positive photoresist layer, wherein the openings expose the film layer and an entirety of the first portion of the negative photoresist; and
removing portions of the film layer corresponding to the openings, without removing the first portion of the negative photoresist layer, wherein
the first wafer edge exposure process comprises causing a cross-linking reaction on the first portion of the positive photoresist layer.

16. The method of claim 15, further comprising:
forming the openings in the positive photoresist layer after removing the portions of the film layer.

17. The method of claim 15, wherein the second wafer edge exposure process uses at least one of an energy level between 30 and 60 mJ/cm$^2$, an energy level of at least 60 mJ/cm$^2$, or a light having a wavelength of about 248 nm.

18. The method of claim 15, wherein performing the second wafer edge exposure process on the first portion of the positive photoresist layer comprises:
using an energy level that is sufficient to cause a cross-link reaction on the first portion of the positive photoresist layer.

19. The method of claim 15, wherein patterning the positive photoresist layer comprises:
using a mask and an energy source to create a plurality of exposed central portions of the positive photoresist layer; or
using a nano-imprint process; or
using a direct e-beam writing with the negative photoresist layer.

20. The method of claim 19, wherein the energy source is selected from the group consisting of a light and an electron beam.

* * * * *